United States Patent
Van Rossen et al.

(10) Patent No.: US 11,340,284 B2
(45) Date of Patent: May 24, 2022

(54) COMBINED TRANSMITTED AND REFLECTED LIGHT IMAGING OF INTERNAL CRACKS IN SEMICONDUCTOR DEVICES

(71) Applicant: KLA Corporation, Milpitas, CA (US)

(72) Inventors: Kristiaan Van Rossen, Bierbeek (BE); Christophe Wouters, Balen (BE)

(73) Assignee: KLA Corporation, Milpitas, CA (US)

( * ) Notice: Subject to any disclaimer, the term of this patent is extended or adjusted under 35 U.S.C. 154(b) by 135 days.

(21) Appl. No.: 16/926,757

(22) Filed: Jul. 12, 2020

(65) Prior Publication Data
US 2021/0025934 A1    Jan. 28, 2021

Related U.S. Application Data

(60) Provisional application No. 62/877,675, filed on Jul. 23, 2019.

(51) Int. Cl.
*G01R 1/04* (2006.01)
*G01R 31/265* (2006.01)
(Continued)

(52) U.S. Cl.
CPC ....... *G01R 31/2656* (2013.01); *G01R 1/0408* (2013.01); *H01L 21/67288* (2013.01); *H01L 22/12* (2013.01)

(58) Field of Classification Search
CPC .... G01R 31/2656; G01R 1/0408; G01R 1/04; G01R 31/265; G01R 31/2831;
(Continued)

(56) References Cited

U.S. PATENT DOCUMENTS 7,086,303 B2   8/2006   Matsushita
10,190,994 B2  1/2019   Truyens
(Continued)

FOREIGN PATENT DOCUMENTS

CN   101650155 A    2/2010
JP   H11132958 A    5/1999
(Continued)

OTHER PUBLICATIONS

ISA/KR, ISR for PCT/US2020/042700, Nov. 2, 2020.
ISA/KR, WO for PCT/US2020/042700, Nov. 2, 2020.

*Primary Examiner* — Jermele M Hollington
*Assistant Examiner* — Courtney G McDonnough
(74) *Attorney, Agent, or Firm* — Hodgson Russ LLP

(57) ABSTRACT

A first light source is directed at an outer surface of a workpiece in an inspection module. The light from the first light source that is reflected from the outer surface of the workpiece is directed to the camera via a first pathway. The light from the first light source transmitted through the workpiece is directed to the camera via a second pathway. A second light source is directed at the outer surface of the workpiece 180° from that of the first light source. The light from the second light source that is reflected from the outer surface of the workpiece is directed to the camera via the second pathway. The light from the second light source transmitted through the workpiece is directed to the camera via the first pathway.

20 Claims, 7 Drawing Sheets

(51) Int. Cl.
*H01L 21/66* (2006.01)
*H01L 21/67* (2006.01)

(58) Field of Classification Search
CPC ... H01L 21/67288; H01L 22/12; H01L 21/66; H01L 21/67; G01N 21/8806; G01N 21/9501; G01N 2021/558; G01N 2021/8841; G01N 2021/8845; G01N 21/9505
USPC ..................................................... 324/754.23
See application file for complete search history.

(56) References Cited

U.S. PATENT DOCUMENTS

| | | |
|---|---|---|
| 10,324,044 B2 | 6/2019 | Mariovet et al. |
| 2011/0135188 A1 | 6/2011 | Chang et al. |
| 2012/0307236 A1 | 12/2012 | Ortner et al. |
| 2019/0302033 A1 | 10/2019 | Marivoet et al. |

FOREIGN PATENT DOCUMENTS

| | | | | |
|---|---|---|---|---|
| JP | 2000171226 A | * | 6/2000 | ............. G01B 11/24 |
| JP | 2015219224 A | | 12/2015 | |

* cited by examiner

COMBINED TRANSMITTED AND REFLECTED LIGHT IMAGING OF INTERNAL CRACKS IN SEMICONDUCTOR DEVICES

CROSS-REFERENCE TO RELATED APPLICATIONS

This application claims priority to the provisional patent application filed Jul. 23, 2019 and assigned U.S. App. No. 62/877,675, the disclosure of which is hereby incorporated by reference.

FIELD OF THE DISCLOSURE

This disclosure relates to defect detection in workpieces.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Defect detection at the sides of a workpiece, such as a semiconductor wafer or part of a semiconductor wafer, is increasing in importance as semiconductor devices become more advanced. FIGS. 1 and 2 illustrate a previous system for finding side defects in a workpiece. The system 100 of FIG. 1 detects superficial defects or interior defects that extend to a workpiece surface by looking at the sides of a workpiece. FIG. 2 is a schematic representation of an image obtained using the system 100 of FIG. 1. The system 100 has four mirrors, such as mirrors 101, that face each other in a square arrangement. The workpiece 102 (or other object under inspection) is positioned in a cavity between the mirrors 101. The workpiece 102 has a side defect 103.

A camera 104 with lens 105 looks at the bottom face of the workpiece 102. The mirrors 101 are arranged at a 45° angle with each of the four side faces (two of which are illustrated in the cross-section of FIG. 1). Deviation angles of ±2° are possible due to non-telecentric optics. The system 100 of FIG. 1 is used to obtain an image 106, as shown in FIG. 2, of the bottom surface of the workpiece 102 and images 107a-107d of each of the four side surfaces of the workpiece 102 (see FIG. 2). Coaxial illumination can be positioned between the camera 104 and lens 105 and the workpiece 102. Only reflected light images of the four sides of the workpiece 102 are imaged using the four mirrors 101.

The design of system 100 has drawbacks. The system 100 can only use reflected light. Thus, the system must be larger to support both reflected and transmitted light. Equipment with a smaller footprint is preferred in semiconductor manufacturing facilities. For transmitted light images, the system has low inspection speed. For reflected light images, the system 100 tends to suffer from large inspection overkill caused by rough, superficial dicing marks on the workpiece. These dicing marks are resolved, visualized, and/or highlighted by the imaging setup, but are typically not a reason to reject a workpiece 102 under inspection.

Both underkill and overkill are expensive and should be minimized if possible. Overkill is the risk of falsely rejecting a good workpiece. Underkill is the risk of failing to reject an actual bad workpiece.

An additional drawback of the system 100 is that reflected and transmitted light image acquisitions for the same workpiece are spread over multiple inspection apparatuses and are spread over time. This makes it more difficult to combine images for processing and post-processing purposes.

Therefore, improved systems and methods are needed.

BRIEF SUMMARY OF THE DISCLOSURE

A system is provided in a first embodiment. The system includes a vacuum pump, a nozzle in fluid communication with the vacuum pump, a nozzle actuator configured to move the nozzle, and an inspection module. The nozzle is configured to hold a workpiece. The inspection nozzle includes: a first light source, a second light source, a first mirror, a second mirror, a first semi-mirror, a second semi-mirror, a camera, a third mirror, and a fourth mirror. The first mirror is disposed to receive light from the first light source. The first mirror directs the light from the first light source at an outer surface of the workpiece. The second mirror is disposed to receive light from the second light source. The second mirror directs the light from the second light source at the outer surface of the workpiece. The first semi-mirror is disposed between the first light source and the first mirror. The first semi-mirror receives the light from the first light source that is reflected from the outer surface of the workpiece and the light from the second light source that is transmitted through the workpiece. The second semi-mirror is disposed between the second light source and the second mirror. The second semi-mirror receives the light from the second light source that is reflected from the outer surface of the workpiece and the light from the first light source that is transmitted through the workpiece. The camera receives the light from the first light source and the second light source. The third mirror is disposed to direct the light from the first semi-mirror to the camera. The fourth mirror is disposed to direct the light from the second semi-mirror to the camera.

The first light source and the second light source can be LEDs.

The system can further include at least one optical lens disposed between the camera and the third mirror and the fourth mirror.

The system can further include a camera actuator configured to move the camera relative to the third mirror and the fourth mirror.

The first mirror and the second mirror can be disposed on opposite sides of the outer surface of the workpiece.

The system can further include a second of the inspection module. The first mirror and the second mirror of the second of the inspection module are disposed at a 90° angle relative to the first mirror and the second mirror of the inspection module, respectively. The nozzle actuator can be configured to move the workpiece between the inspection module and the second of the inspection module.

A method is provided in a second embodiment. The method includes directing light from a first light source at an outer surface of a workpiece in a first inspection module. The light from the first light source reflected from the outer surface of the workpiece is received at a camera. The light from the first light source that is reflected from the outer surface of the workpiece is directed to the camera via a first mirror and a first semi-mirror. The light from the first light source transmitted through the workpiece is received at the camera. The light from the first light source that is transmitted through the workpiece is directed to the camera via a second mirror and a second semi-mirror.

The method can further include, using the camera, taking an image of the light from the first light source that is reflected from the outer surface of the workpiece and an image of the light from the first light source transmitted through the workpiece in a single exposure of a sensor in the camera.

The method can further include directing light in the first inspection module from a second light source at a point on the outer surface of a workpiece 180° from that of the first light source. The directing light from the second light source is simultaneous with the directing light from the first light source. The light from the second light source is at a lower intensity than that of the first light source.

In an instance, the method can further include directing light from a second light source at a point on the outer surface of a workpiece 180° from that of the first light source in the first inspection module. The light from the second light source reflected from the outer surface of the workpiece can be received at the camera. The light from the second light source that is reflected from the outer surface of the workpiece is directed to the camera via the second mirror and the second semi-mirror. The light from the second light source transmitted through the workpiece can be received at the camera. The light from the second light source that is transmitted through the workpiece is directed to the camera via the first mirror and the first semi-mirror.

In this instance, the method can further include, using the camera, taking an image of the light from the second light source that is reflected from the outer surface of the workpiece and an image of the light from the second light source transmitted through the workpiece in a single exposure of a sensor in the camera.

In this instance, the method can further include directing light from the first light source at a point on the outer surface of a workpiece 180° from that of the second light source in the first inspection module. The directing light from the first light source is simultaneous with the directing light from the second light source. The light from the first light source is at a lower intensity than that of the second light source.

The method can further include positioning a focal plane inside the workpiece by adjusting a position of the camera and/or the first mirror, the first semi-mirror, and the first light source.

The method can further include tuning a wavelength of the light from the first light source thereby adjusting a penetration depth of the light from the first light source in the workpiece.

In an instance, the method can further includes positioning the workpiece on a nozzle in fluid communication with a vacuum pump and moving the workpiece on the nozzle relative to the first mirror using a nozzle actuator.

In this instance, the method can further include moving the workpiece from the first inspection module to a second inspection module.

In this instance, the method can further include directing light from a first light source at the outer surface of a workpiece in the second inspection module. The light from the first light source reflected from the outer surface of the workpiece is received at a camera in the second inspection module. The light from the first light source that is reflected from the outer surface of the workpiece is directed to the camera in the second inspection module via a first mirror and a first semi-mirror in the second inspection module. The light from the first light source transmitted through the workpiece is received at the camera in the second inspection module. The light from the first light source that is transmitted through the workpiece is directed to the camera in the second inspection module via a second mirror and a second semi-mirror in the second inspection module. The first mirror and the second mirror of the second inspection module are disposed at a 90° angle relative to the first mirror and the second mirror of the first inspection module, respectively.

In this instance, the method can further include directing light from a second light source at a point on the outer surface of a workpiece 180° from that of the first light source in the second inspection module. The light from the second light source reflected from the outer surface of the workpiece is received at the camera in the second inspection module. The light from the second light source that is reflected from the outer surface of the workpiece is directed to the camera in the second inspection module via the second mirror and the second semi-mirror in the second inspection module. The light from the second light source transmitted through the workpiece is received at the camera in the second inspection module. The light from the second light source that is transmitted through the workpiece is directed to the camera in the second inspection module via the first mirror and the first semi-mirror in the second inspection module.

The workpiece can be fabricated of one of silicon, gallium nitride, or gallium arsenide.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
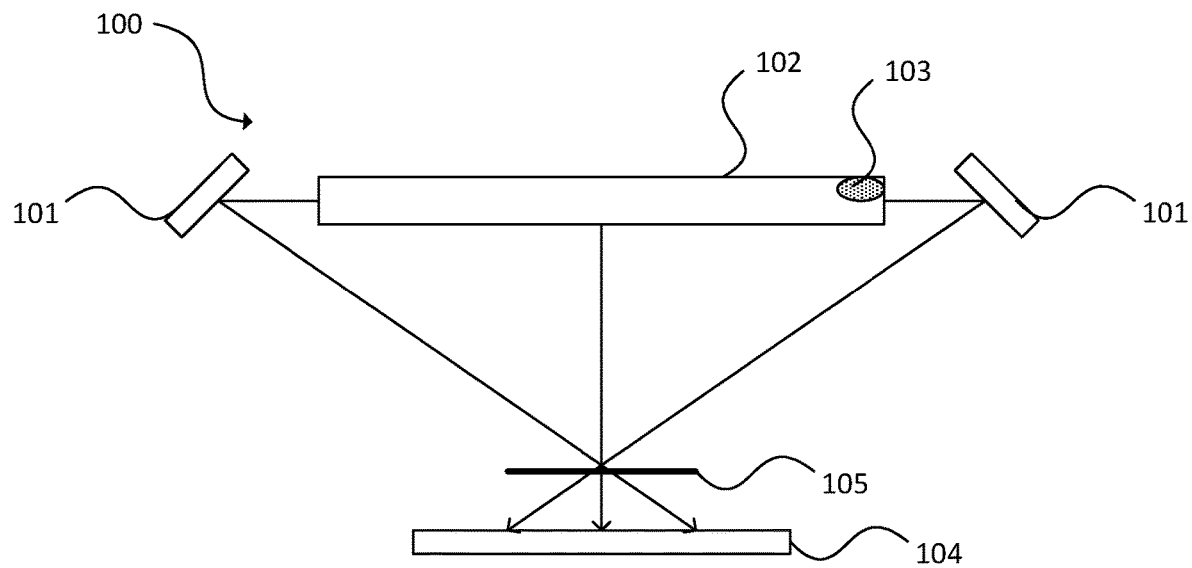
FIGS. 1 and 2 illustrate a previous system for finding side defects in a workpiece.
Figure 2:
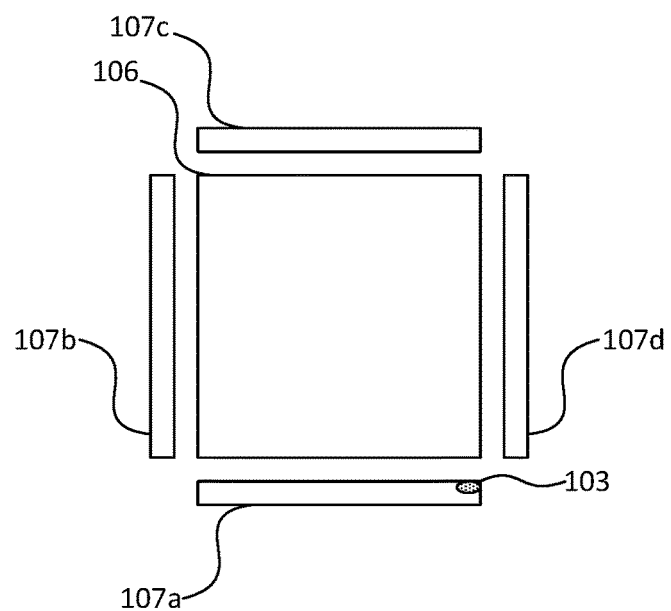

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the inspection apparatus disclosed herein can enable the simultaneous acquisition (i.e., in a single camera sensor exposure) of a reflected light image of one side and a transmitted light image of the opposite side of a workpiece that is at least partially transparent to the light wavelengths of a light source that is illuminating the one side of the workpiece. The workpiece can be a semiconductor wafer, part of a semiconductor wafer, or other object. For example, the workpiece can be a singulated die, such as a silicon die from 0.5 mm by 0.5 mm to 15 mm by 15 mm. Larger dies, such as dies with a size of 35 mm by 35 mm, are possible. The dies can be formed from a 300 mm wafer, which is in a preceding step is diced with blades and or lasers in one or multiple steps to singulate the individual dies.

The transmitted light image can visualize internal defects inside the workpiece, while the reflected light image can find superficial defects occurring only at the surface of the workpiece under inspection. Combining the results of the inspection of both images improves overkill and underkill rate of the overall inspection of the workpiece. Distinction can be made between superficial defects of the workpiece that are visible in reflected light image only, which are still considered as part of a good workpiece by a semiconductor manufacturer, and internal defects inside the workpiece that are visible in the transmitted image only, which are considered as part of a bad workpiece by a semiconductor manufacturer. The bad workpiece should be scrapped or further inspected. Thus, if the algorithm detects the defect in the reflected image and not in the transmitted image, it is considered a good workpiece, which reduces overkill. Likewise, the recipe for the transmitted light image can be set up to be sensitive enough to detect the smallest/lowest contrast potential defects and then classify as a bad workpiece in case the potential defect is not detected in the reflected light image, which reduces underkill.

Using embodiments disclosed herein, the transmitted and reflected light images of a side of the workpiece can be acquired one after the other (i.e., in two consecutive camera sensor exposures) by illuminating one side for the first image acquisition and then illuminating the opposite side for the second image acquisition. Based on the nature of the workpiece under inspection, the transmitted and reflected light images of opposite sides of the workpiece, one after the other, can be acquired using embodiments disclosed herein. This may use four consecutive camera sensor exposures for all sides of a workpiece.

Embodiments disclosed herein can be implemented and used in two optical path orientations. One implementation images two opposite sides of the workpiece. Another implementation images the two adjacent opposite sides of a workpiece. The latter is obtained by rotating the optical path 90° with respect to the first optical path. In an embodiment of a system, both orientations can be integrated to inspect all four sides of the workpiece. In another embodiment, both 0° and 90° rotated optical paths can be included in one system such that all four workpiece sides can be imaged with a single camera sensor.

Embodiments disclosed herein can enable acquisition of images of workpieces of different sizes by changing camera position and/or positions of the mirrors. For example, actuators can be used to change their positions to accommodate workpieces of different sizes.

Embodiments of this inspection apparatus can be implemented with a line sensor camera or an area sensor camera and can be implemented with LED, superluminescent diode (SLD), laser, or halogen light source. Wide band or small band wavelength illuminations of different wavelength ranges, with or without bandpass, cut-on, or cut-off filters, can be used to select certain wavelengths.

Transmitted and reflected light images of the same or opposite sides of the workpiece under inspection can be combined using image processing or post-processing algorithms to discriminate superficial workpiece defects from defects protruding internally in the workpiece under inspection.

Figure 3:
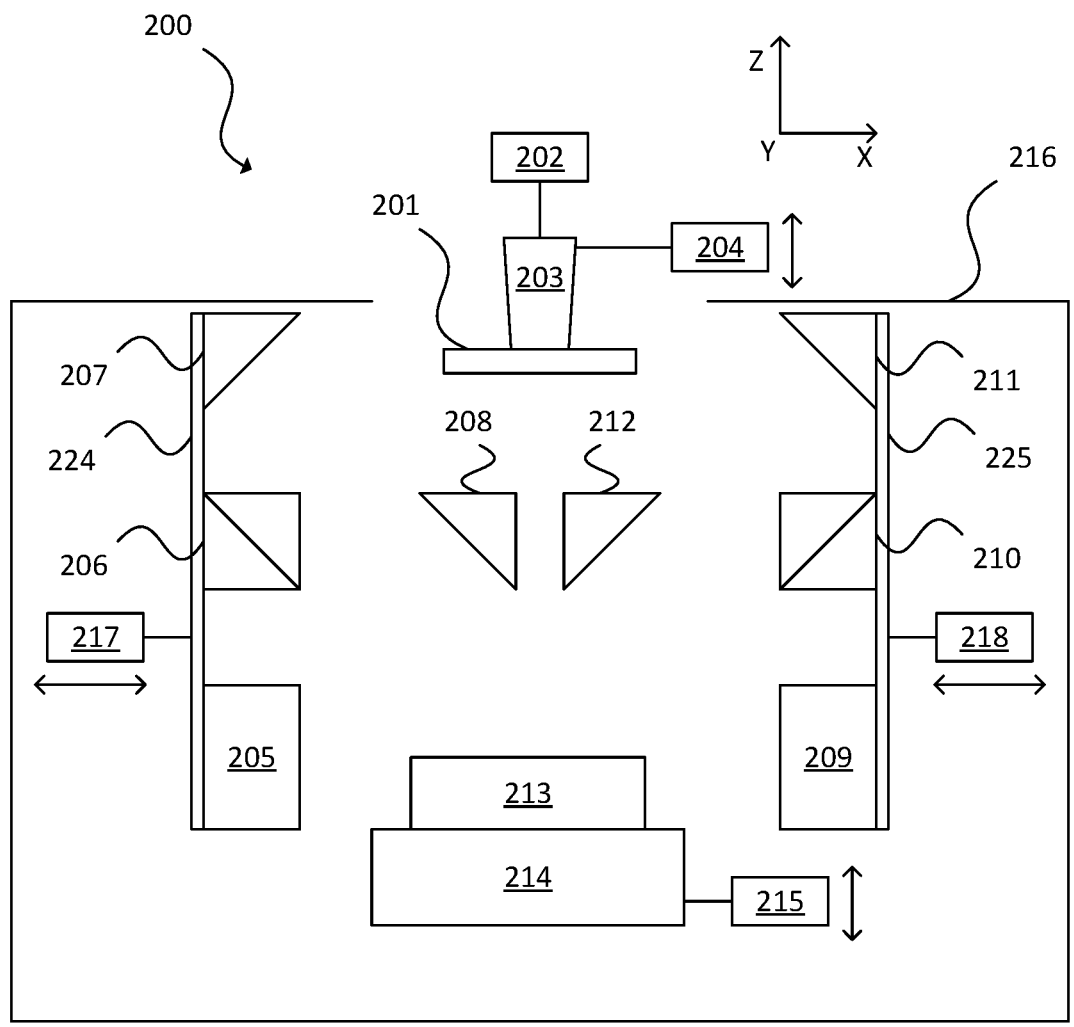
FIG. 3 is a cross-sectional diagram of an embodiment of a system in accordance with the present disclosure.

FIG. 3 is a diagram of an embodiment of a system 200. The system 200 includes a nozzle 203 in fluid communication with a vacuum pump 202. The nozzle 203 is configured to hold a workpiece 201. While a semiconductor die is specifically disclosed as workpiece 201, other workpieces also can be used as workpiece 201. A nozzle 203 that uses vacuum to hold the workpiece 201 is illustrated, but magnetic or mechanical clamping also can be used.

A nozzle actuator 204 can move the nozzle 203 and, consequently, the workpiece 201, in a Z direction indicated by the arrows. Thus, the workpiece 201 can be positioned between the first mirror 207 and second mirror 211 using the nozzle actuator 204. The nozzle actuator 204 also can move the nozzle 203 and workpiece 201 in the X direction or Y direction. The nozzle actuator 204 also can move the nozzle 203 and workpiece 201 in three perpendicular directions (i.e., X, Y, and Z directions).

The workpiece 201 can be made of silicon, gallium nitride, gallium arsenide, or other materials. The workpiece 201 also can be made of glass. Advanced semiconductor devices can be inspected using embodiments disclosed herein. Thus, workpieces with transparent, translucent, or non-transparent materials can be inspected using the system 200. However, the workpiece may be transparent to at least some wavelengths of light to use the design of the system 200. Cracks, chipping, contamination (e.g., internal contamination), foreign materials (e.g., dust or dirt), or other defects can be detected.

The workpiece 201 can be positioned in an inspection module 216. The inspection module 216 includes a first light source 205 and a second light source 209. The first light source 205 and/or second light source 209 can be LEDs, SLDs, lasers, or halogen light sources.

In an instance, the first light source 205 and second light source 209 are LEDs that have a narrow bandwidth around 1550 nm. Other wavelengths are possible and this value is merely one example.

In another instance, the first light source 205 and second light source 209 are halogen light sources with a filter.

A first mirror 207 can be positioned to receive light from the first light source 205. The first mirror 207 can direct the light from the first light source at an outer surface of the workpiece 201. The workpiece 201 can be square, rectangular, polygonal, round, or other shapes. The first mirror 207 can deflect the light.

A second mirror 211 can be positioned to receive light from the second light source 209. The second mirror can direct the light from the second light source 209 at the outer surface of the workpiece 201. The second mirror 211 can deflect the light.

The first mirror 207 and the second mirror 211 can be positioned on opposite sides of the outer surface of the workpiece 201. Thus, the first mirror 207 and the second mirror 211 can be 180° opposite each other relative to a center of the workpiece 201.

A first semi-mirror 206 can be positioned in the path of light between the first light source 205 and the first mirror 207. In an instance, the first semi-mirror 206 receives the light from the first light source 205 that is reflected from the outer surface of the workpiece 201 and/or the light from the second light source 209 that is transmitted through the workpiece 201. The first semi-mirror 206 directs light to the third mirror 208.

A second semi-mirror 210 can be positioned in the path of light between the second light source 209 and the second mirror 211. In an instance, the second semi-mirror 210 receives the light from the second light source 209 that is reflected from the outer surface of the workpiece 201 and/or the light from the first light source 206 that is transmitted through the workpiece 201. The second semi-mirror 210 directs light to the fourth mirror 212.

A semi-mirror can be partially transparent and partially reflective to the beam of light. For example, the reflective portion of the semi-mirror may only be positioned partially in a beam of light, which reflects only some of the light. The semi-mirror also can be a half mirror that reflects some of the light and is penetrated by the rest. Other semi-mirror configurations are possible. The first semi-mirror 206 and second semi-mirror 210 can instead be beam splitters or other optical components.

A camera 214, which can be coupled with one or more lenses 213, receives the light from the first light source 205 and/or the second light source 209. The camera 214 can be a line sensor camera or an area sensor camera. The light from the first light source 205 and/or the second light source 209 can be imaged at the same point on the sensor of the camera 214 or different points on the sensor of the camera 214.

The one or more lenses 213 can be positioned in the path of light between the camera 214 and a third mirror 208 and fourth mirror 212. The third mirror 208 can be positioned to direct the light from the first semi-mirror 206 to the camera 214 using deflection. The fourth mirror can be positioned to direct the light from the second semi-mirror 210 to the camera 214 using deflection.

A camera actuator 215 can be configured to move the camera 214 (with or without the one or more lenses 213) relative to the third mirror 208 and fourth mirror 212 in a direction perpendicular to the camera plane and/or in the camera sensor plane (e.g., in the X, Y, or Z directions). The camera actuator 215 also can move the camera 214 and the lenses 213 relative to each other in an embodiment.

The camera 214 can be connected to a framegrabber (not illustrated). The framegrabber can apply image processing to the acquired images to capture defects in the workpiece under inspection, such as the workpiece 201.

A processor (not illustrated) in electronic communication with the camera, can concatenate transmitted and reflected images of both opposite sides into a single image instance for further image processing. The processor may be coupled to the components of the system 200 in any suitable manner (e.g., via one or more transmission media, which may include wired and/or wireless transmission media) such that the processor can receive output. The processor may be configured to perform a number of functions using the output. The system 200 can receive instructions or other information from the processor.

The processor, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor may be implemented in practice by any combination of hardware, software, and firmware. Also, its functions as described herein may be performed by one unit, or divided up among different components, each of which may be implemented in turn by any combination of hardware, software, and firmware. Program code or instructions for the processor to implement various methods and functions may be stored in readable storage media, such as a memory in the electronic data storage unit.

The first light source 205, first mirror 207, and first semi-mirror 206 can be moved in a horizontal direction (e.g., X direction or Y direction) using the first horizontal actuator 217. The second light source 209, second mirror 211, and second semi-mirror 210 can be moved in a horizontal direction (e.g., X direction or Y direction) using the second horizontal actuator 218. The first horizontal actuator 217 and the second horizontal actuator 218 can be used to adjust focus or to accommodate a wider workpiece 201. While a first horizontal actuator 217 and second horizontal actuator 218 are disclosed, a single actuator can be used with a transmission to reposition these components.

For example, the first light source 205, first mirror 207, and first semi-mirror 206 can be positioned on a first bracket 224 that ensures that spacing between these three components in the Z direction does not change. The second light source 209, second mirror 211, and second semi-mirror 210 can be fixed to a second bracket 225 at ensures that spacing between these three components in the Z direction does not change. The first bracket 224 can be moved using the first actuator 217. The second bracket 225 can be moved using the second actuator 218. The first bracket 224 and second bracket 225 can be moved horizontally (e.g., X direction or Y direction), simultaneously inwards and outwards, and symmetrically with respect to an optical axis of the camera 214. Thus, the system 200 can acquire images of workpieces with different sizes. Asymmetric movement of the first bracket 224 and second bracket 225 also is possible. Alternatively or additionally, the camera 214 and optionally lens 213 can be moved in the Z direction.

The first mirror 207, second mirror 211, third mirror 208, and fourth mirror 212 are illustrated as 45° mirrors, but other designs are possible.

Using the system 200, functionality is combined to acquire transmitted light images and reflected light images of sides of the workpieces in one system. The system 200 can accommodate different workpiece sizes. The optical path has a focal plane at both opposite sides of the workpiece 201 or other object under inspection. This is for both transmitted and reflected light imaging. Images of the opposite sides of the workpiece are imaged side-by-side on the camera 214. This allows higher speed inspection in a compact apparatus, which has a smaller footprint, and provides additional possibilities for processing or post-processing because reflected and transmitted light images of the workpiece 201 are combined.

The reflected light image using system 200 contains two light response parts: one part is the direct reflection from the illuminated side of the workpiece 201 and a second part is the light that transmits back through the illuminated side after transmission through the workpiece 201 and reflection at the opposite side of the illuminated side. This second part also contains the light transmitted back through the illuminated side after multiple internal reflections between these opposite sides. This second light response part can be referred to as "secondary reflection." The direct reflected part is dominant and can be referred to as "primary reflection." The secondary reflection can suppress the primary reflection (undesired) signal from the (rough) superficial dicing marks at the illuminated side of the workpiece in the overall reflected light imaging, which reduces the overkill linked to these dicing marks. Light scattered by the superficial dicing marks at primary reflection is compensated by the secondary reflected light. Both add up in the image acquisition and, hence, the signal of the superficial dicing marks is suppressed. This overkill is a serious drawback of previous techniques that used only reflected imaging.

While the light collected by the camera 214 is illustrated in the Z direction, one or more additional mirrors can be added (not illustrated) so that the light collected by the camera 214 goes into or out of the page (i.e., in the Y direction). The camera 214 can be positioned appropriately to acquire images with this redirected light.

The wavelength used in the embodiments disclosed herein should allow for light transmission and integration. Thus, the workpiece can be transparent or translucent for the applied wavelengths of the light source, and the camera can be sensitive to some extent to these applied wavelengths. The camera 214 can be a VIS (visual light) or NIR (near-infrared, such as below 1200 nm) sensitivity-enhanced silicon sensor-based camera, which can operate with or without combination with infrared-to visible wavelength conversion optical parts. In a particular instance, the camera 214 is uses a colloidal quantum dot-based sensor.

During operation, the workpiece 201 is placed between the first mirror 207 and second mirror 211. The first mirror 207 and second mirror 211 and/or camera 214 are positioned such that the two opposite sides of the workpiece 201 are in the focal plane of the camera 214. Then the first light source 205 is turned on to create the primary and secondary reflected light image of the left side and the transmitted light image of the right side of the workpiece 201.

The emitted light travels through the first semi-mirror 206, is deflected by the first mirror 207, is primary and secondary reflected back by the left side of the workpiece 201, is deflected by the first mirror 207, by the semi-mirror 206, by the third mirror 208, and then is imaged by the lens 213 on the camera 214. Simultaneously, the emitted light travels through the first semi-mirror 206, is deflected by the first mirror 207, is transmitted through the workpiece 201, is deflected by the second mirror 211, by the second semi-mirror 210, by the fourth mirror 212, and then is imaged by the lens 213 on the camera 214.

Then the first light source 205 is turned off and the second light source 209 is turned on to create the primary and secondary reflected light image of the right side of the workpiece 201 and the transmitted light image of the left side of the workpiece 201.

The sensor of camera 214 can be sensitive for the wavelengths of the transmitted light path. For example, silicon workpieces may need infrared wavelength for transparency and the sensor of the camera 214 can be sensitive to infrared wavelengths.

One or both of the two opposing flat surfaces of the workpiece 201, which can be contacted by the nozzle 203, also can be imaged using the system. In an instance, the system can image the two opposing points on the outer surface of the workpiece 201 and a device side (e.g., a flat side) of the workpiece 201.

Figure 4:
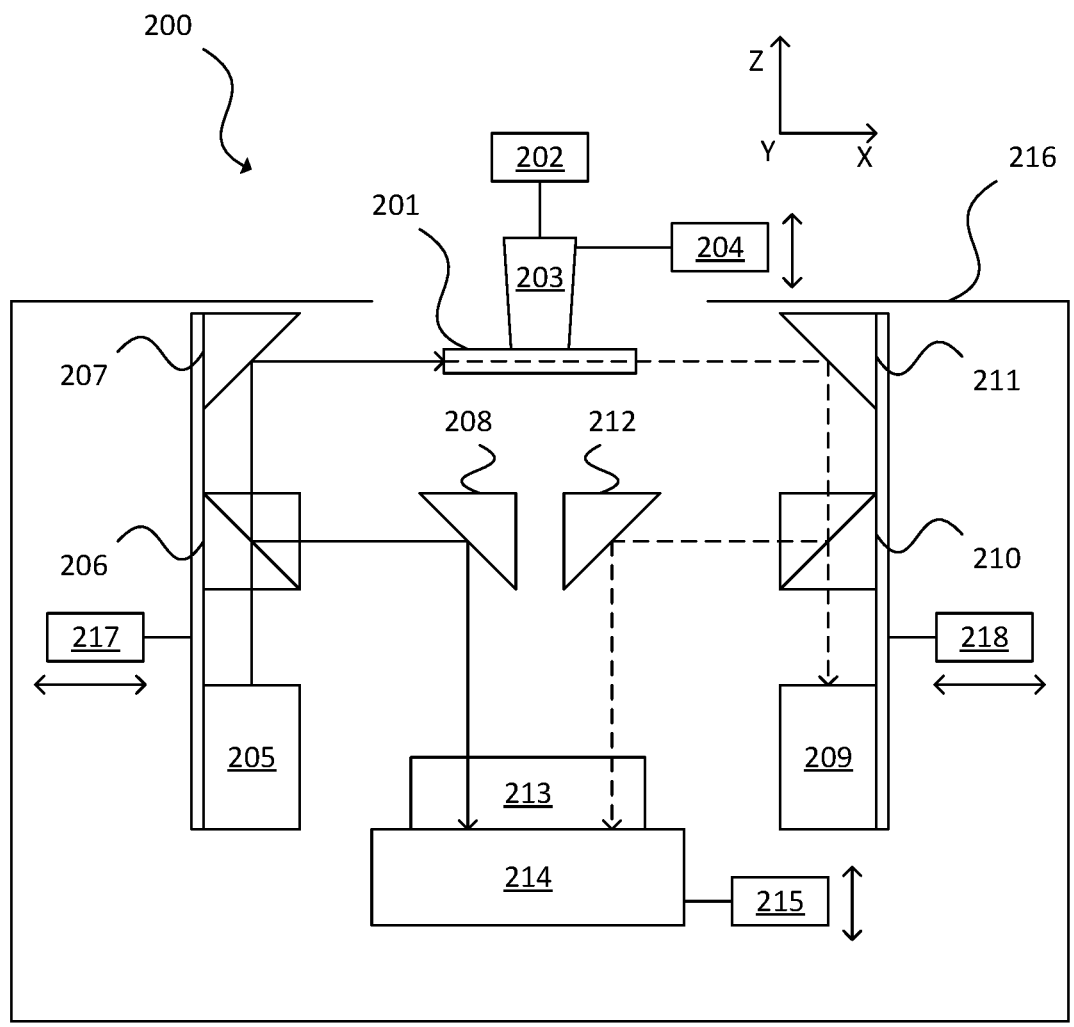
FIG. 4 shows a first example of operation of the system of FIG. 3.

FIG. 4 shows a first example of operation of the system 200 of FIG. 3. As shown in FIG. 4, light from the first light source 205 is directed at an outer surface of the workpiece 201 in the inspection module 216. The second light source 209 is not operating. Light reflected from the outer surface of the workpiece 201 (shown with the solid line) is received by the camera 214. This reflected light includes light from secondary and primary reflection. This light from the first light source 205 reflected from the workpiece 201 is directed to the camera 214 via the first mirror 207 and the first semi-mirror 206. Light transmitted through the workpiece 201 (shown with the dashed line) is also received by the camera 214. The light from the first light source 205 transmitted through the workpiece 201 is directed to the camera 214 via the second mirror 211 and the second semi-mirror 210. The camera 214 can take an image of the light from the first light source 205 reflected from the outer surface of the workpiece 201 and an image of the light from the first light source 205 transmitted through the workpiece 201 in a single exposure of a sensor in the camera 214.

Figure 5:
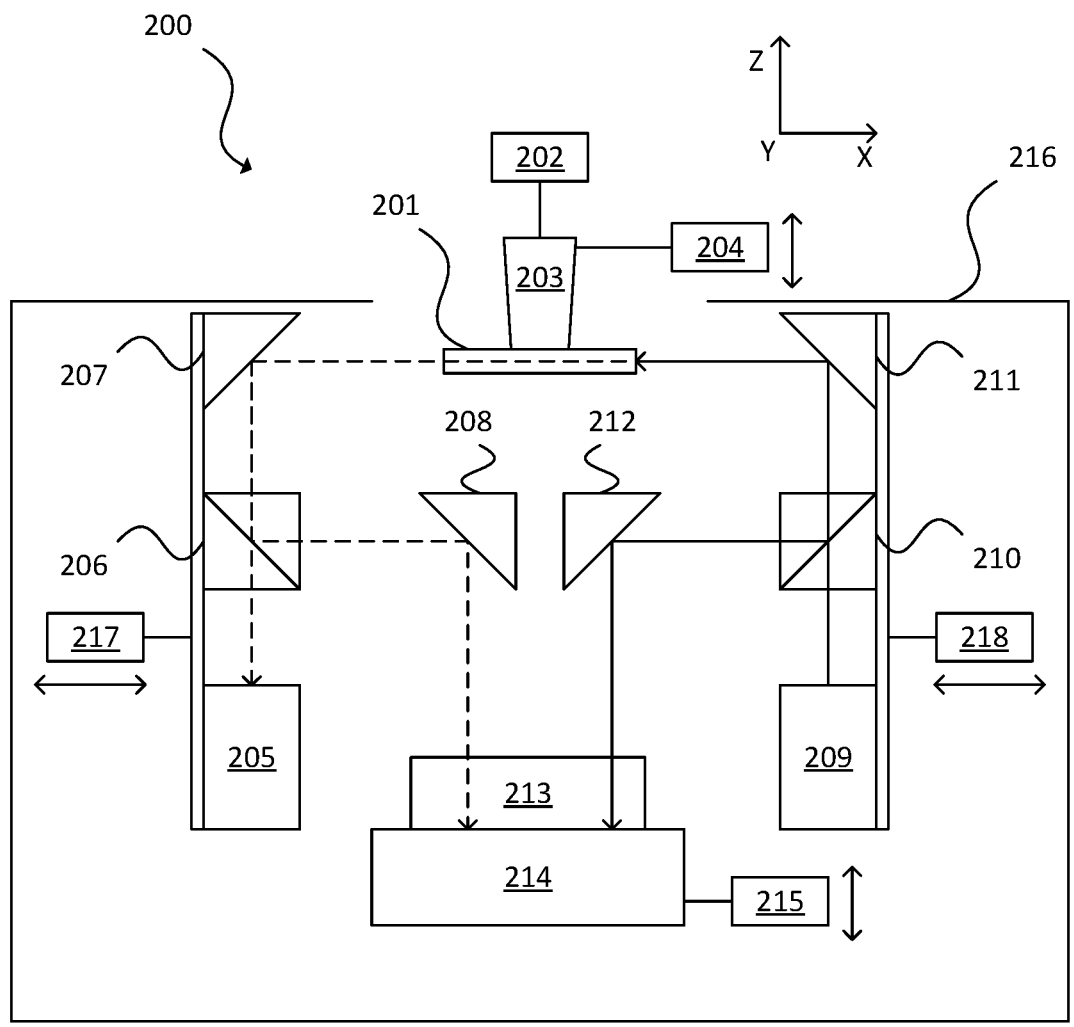
FIG. 5 shows a second example of operation of the system of FIG. 3.

FIG. 5 shows a second example of operation of the system 200 of FIG. 3. As shown in FIG. 5, light from the second light source 209 is directed at an outer surface of the workpiece 201 in the inspection module 216. The second light source 209 directs light at a point on the outer surface of the workpiece 201 180° from a point on the outer surface of the workpiece 201 that the first light source 205 directs light at. The first light source 205 is not operating. Light reflected from the outer surface of the workpiece 201 (shown with the solid line) is received by the camera 214. This reflected light includes light from secondary and primary reflection. This light from the second light source 209 reflected from the workpiece 201 is directed to the camera 214 via the second mirror 211 and the second semi-mirror 210. Light transmitted through the workpiece 201 (shown with the dashed line) is also received by the camera 214. The light from the second light source 209 transmitted through the workpiece 201 is directed to the camera 214 via the first mirror 207 and the first semi-mirror 206. The camera 214 can take an image of the light from the second light source 209 reflected from the outer surface of the workpiece 201 and an image of the light from the second light source 209 transmitted through the workpiece 201 in a single exposure of a sensor in the camera 214.

Figure 6:
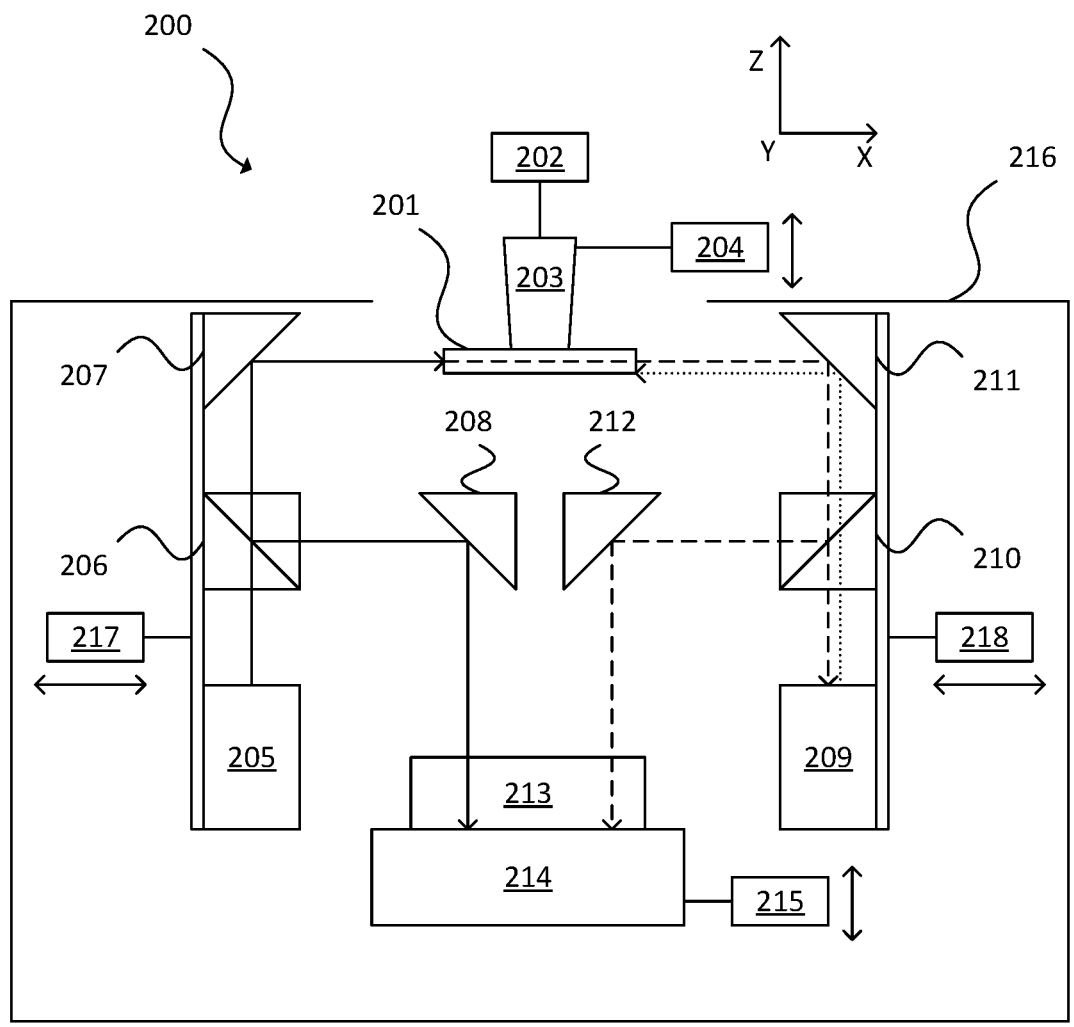
FIG. 6 shows a third example of operation of the system of FIG. 3.

FIG. 6 shows a third example of operation of the system 200 of FIG. 3. The operation in FIG. 6 is similar to that of FIG. 4, but light from the second light source 209 is directed to a point on an outer surface of the workpiece 201 180° from the light directed by the first light source 205. This light from the second light source 209 is shown with a dotted line and is positioned adjacent the light transmitted through the workpiece 201 in FIG. 6 merely for ease of illustration. The pathway of the light from the second light source 209 may be the same as that transmitted through the workpiece 201 by the first light source 205. Operation of the first light source 205 and second light source 209 may be simultaneous. Light from the second light source 209 is at a lower intensity than that of the first light source 205. For example, light from the second light source 209 may be from greater than 0% to approximately 60% of the intensity of the first light source 205. Transmitted light imaging can suffer from dark areas in the region of interest on the workpiece side view due to different surface angles/slants in a dual dicing process (e.g., using two different dicing blades). By also operating the second light source 209 this phenomenon disappears or is at least largely attenuated. Hence, overall signal-to-noise ratio on real defects increases, which enables less overkill and less underkill.

Figure 7:
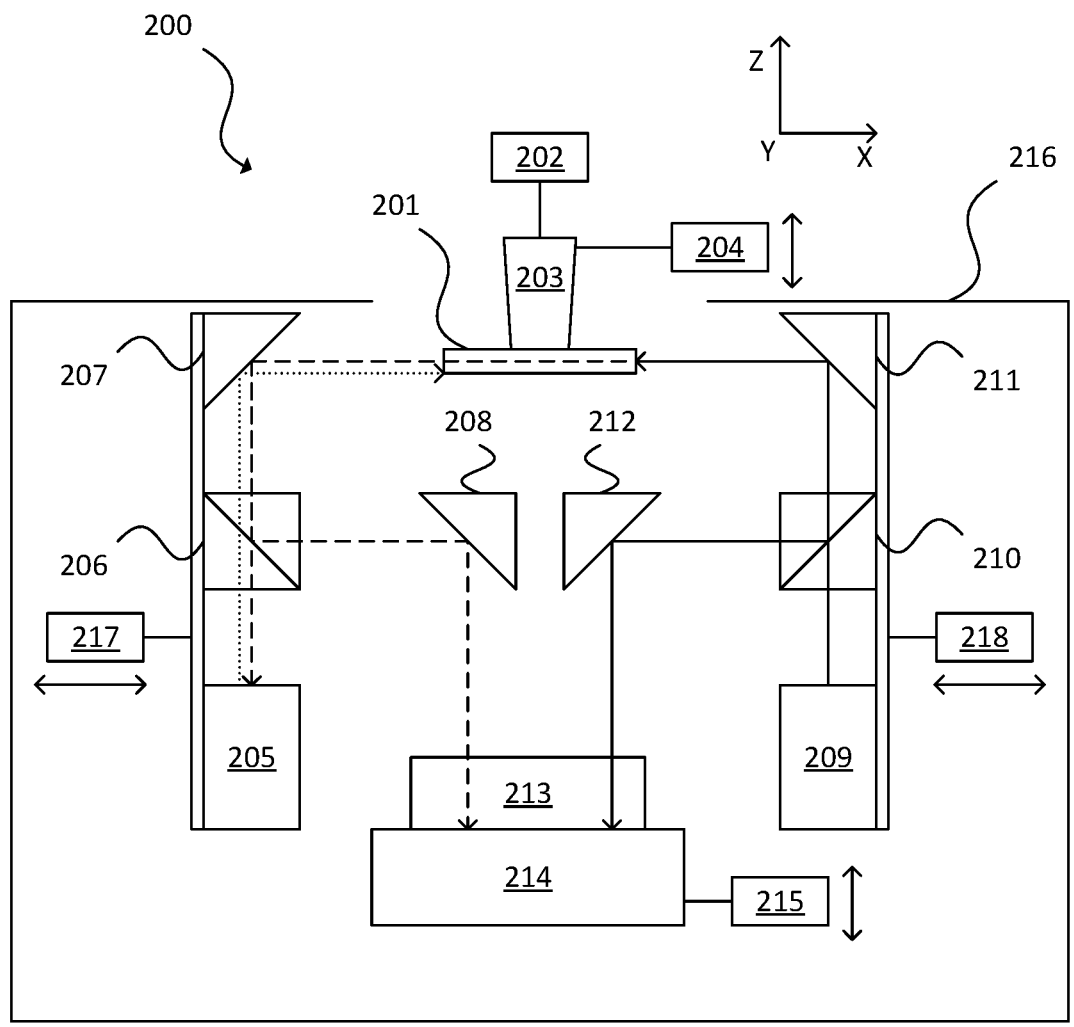
FIG. 7 shows a fourth example of operation of the system of FIG. 3.

FIG. 7 shows a fourth example of operation of the system of FIG. 3. The operation in FIG. 7 is similar to that of FIG. 5, but light from the first light source 205 is directed to a point on an outer surface of the workpiece 201 180° from the light directed by the second light source 209. This light from the first light source 205 is shown with a dotted line and is positioned adjacent the light transmitted through the workpiece 201 in FIG. 7 merely for ease of illustration. The pathway of the light from the first light source 205 may be the same as that transmitted through the workpiece 201 by the second light source 209. Operation of the first light source 205 and second light source 209 may be simultaneous. Light from the first light source 205 is at a lower intensity than that of the second light source 209. For example, light from the first light source 205 may be from greater than 0% to approximately 60% of the intensity of the second light source 209.

In the embodiments of FIG. 4 or FIG. 6, a focal plane can be positioned inside the workpiece 201 by adjusting a position of the camera 214, the first mirror 207, the first semi-mirror 206, and/or the first light source 205. A wavelength of the light from the first light source 205 also can be tuned, which can adjust a penetration depth of the light in the workpiece 201.

In the embodiments of FIG. 5 or FIG. 7, a focal plane can be positioned inside the workpiece 201 by adjusting a position of the camera 214, the second mirror 211, the second semi-mirror 210, and/or the second light source 209. A wavelength of the light from the second light source 209 also can be tuned, which can adjust a penetration depth of the light in the workpiece 201.

A focal plane can be positioned inside the workpiece in any of the embodiments disclosed herein. The mirrors and semi-mirrors setup splits the focal plane to a left and a right focal plane, respectively on the left and right sides of the workpiece. By moving the camera 214 closer to the workpiece 201, both focal planes can be moved simultaneously and symmetrically (i.e., over the same distance) inwards (i.e., inside the workpiece 201). If only the first mirror 207, the first semi-mirror 206, and the first light source 205 are moved closer to the workpiece, only the left focal plane moves inwards (i.e., inside the workpiece 201). The right focal plane position stays unaltered. Similarly, moving only the second mirror 211, the second semi-mirror 210, and the second light source 209 closer to the workpiece 201, only the right focal plane moves inwards (i.e., inside the workpiece 201).

The focal plane also can be a point on the outer surface of the workpiece 201.

In an instance, images are taken sequentially. For example, the imaging schemes of FIG. 4 and FIG. 5 can be performed sequentially. The imaging schemes of FIG. 6 and FIG. 7 can be performed sequentially. A combination of the imaging schemes of FIG. 4 and FIG. 7 or FIG. 5 and FIG. 6 also can be performed.

Figure 8:
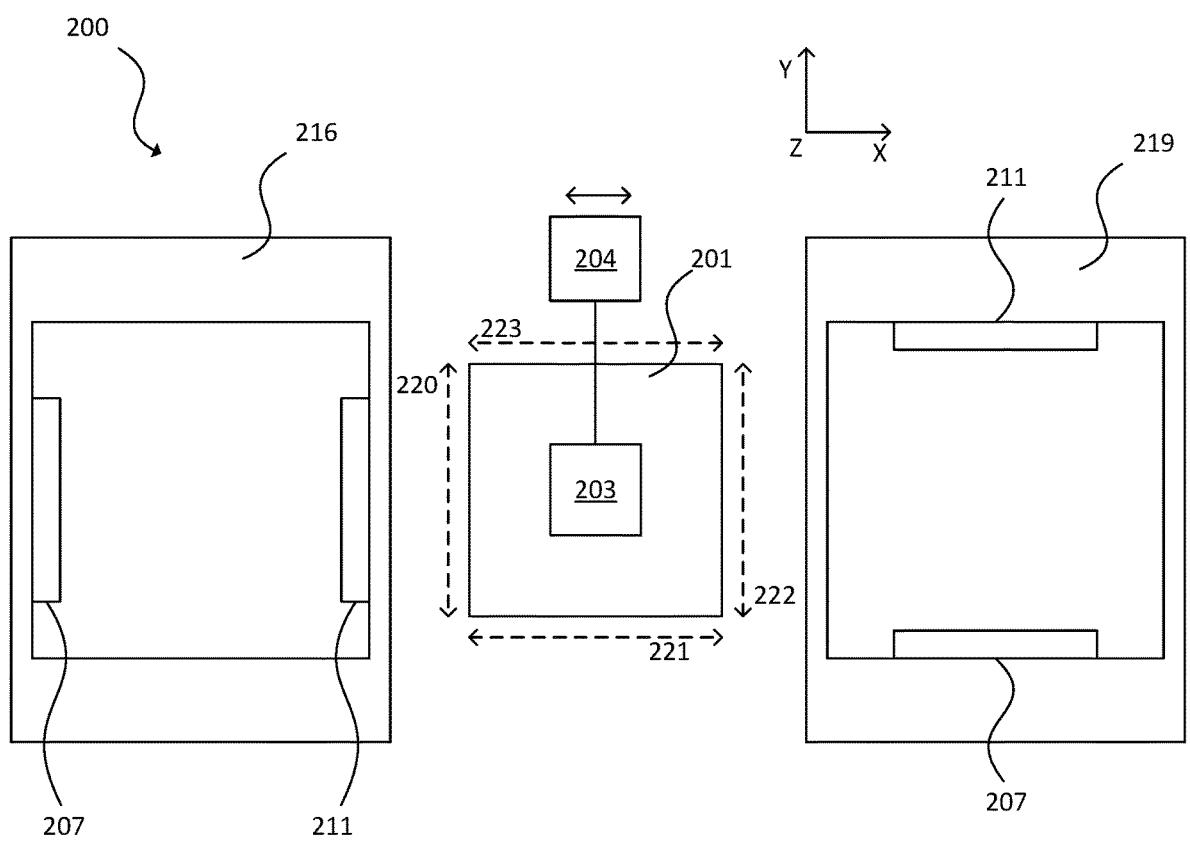
FIG. 8 shows a diagram of another embodiment of the system of FIG. 3.

FIG. 8 shows a diagram of another embodiment of the system 200 of FIG. 3. The system 200 can include a second inspection module 219 substantially the same as the inspection module 216, which can be referred to as a first inspection module. The system 200 also includes a second inspection module 219. The first mirror 207 and second mirror 211 in the first inspection module 216 and the second inspection module 219 are positioned at a 90° degree relative to each other, respectively. Thus, the mirrors, semi-mirrors, and light sources in the first inspection module 216 are rotated 90° degree relative to these components in the second inspection module 219. The first inspection module 216 can image outer surfaces 220 and 222 of the workpiece 201. The second inspection module 219 can image outer surfaces 221 and 223 of the workpiece 201. The outer surfaces 220-223 are shown in dashed straight lights to show the surface that can be imaged.

In the embodiment of FIG. 8, the nozzle actuator 204 can move the workpiece 201 and nozzle 203 between the first inspection module 216 and second inspection module 219. Thus, the nozzle actuator 204 can move the workpiece 201 and nozzle 203 in two or three perpendicular directions (e.g., X, Y, and/or Z directions). The workpiece 201 can be held by the nozzle 203 during this movement.

The second inspection module 219 can operate as shown in the embodiments of FIGS. 4-7. The images of the workpiece 201 using the second inspection module 219 is at different parts of the outer surface of the workpiece 201 than the first inspection module 216.

In another embodiment to acquire reflected and transmitted light images of the two sets of outer surfaces 220 and 222 and outer surfaces 221 and 223, the system 200 can include only the first inspection module 216. The first inspection module 216 can spin the workpiece 201 90° on the nozzle 203. The first inspection module 216 also can rotate the various mirrors, light sources, semi-mirrors, and optionally the camera in the first inspection module 216, such as by 90°. An actuator can be used to rotate the various mirrors, light sources, semi-mirrors, camera, or other components in this embodiment.

Using embodiments disclosed herein, transmitted and reflected light images can be acquired in one system with the ability to simultaneously acquire a transmitted light image of one workpiece side (and optionally its adjacent side) of a workpiece and a reflected light image of the opposite workpiece side (and optionally its adjacent side) in one single image acquisition step (e.g., in one single camera sensor exposure). The transmitted and reflected light images of both opposite sides of the workpiece can be acquired one after the other (e.g., in two consecutive camera sensor exposures) on the same camera sensor by illuminating the first side for the first image acquisition and then illuminating the second side for the second image acquisition. These operations can be performed with or without moving parts or lens refocusing during or between consecutive image acquisitions.

Furthermore, the creation and use of secondary reflection in the reflected light imaging method can suppress rough superficial dicing marks and, hence, reduce overkill on workpieces that are inspected.

The focal planes can be positioned at different locations inside the workpiece under inspection to determine the internal defect location by changing camera and/or light sources and mirror positions.

Different penetration depth of the light at different wavelengths can be performed by tuning the wavelengths while acquiring a plurality of images. The different images can be used to provide better discrimination between defects at the surface of the workpiece under inspection and defects that are more internal in the workpiece under inspection. This can improve the defect capture rate and inspection performance.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a vacuum pump;
a nozzle in fluid communication with the vacuum pump, wherein the nozzle is configured to hold a workpiece;
a nozzle actuator configured to move the nozzle; and
an inspection module that includes:
a first light source;
a second light source;

a first mirror that is disposed to receive light from the first light source, wherein the first mirror directs the light from the first light source at an outer surface of the workpiece;
a second mirror that is disposed to receive light from the second light source, wherein the second mirror directs the light from the second light source at the outer surface of the workpiece;
a first semi-mirror disposed between the first light source and the first mirror, wherein the first semi-mirror receives the light from the first light source that is reflected from the outer surface of the workpiece and the light from the second light source that is transmitted through the workpiece;
a second semi-mirror disposed between the second light source and the second mirror, wherein the second semi-mirror receives the light from the second light source that is reflected from the outer surface of the workpiece and the light from the first light source that is transmitted through the workpiece;
a camera that receives the light from the first light source and the second light source;
a third mirror that is disposed to direct the light from the first semi-mirror to the camera; and
a fourth mirror that is disposed to direct the light from the second semi-mirror to the camera.

2. The system of claim 1, wherein the first light source and the second light source are LEDs.

3. The system of claim 1, further comprising at least one optical lens disposed between the camera and the third mirror and the fourth mirror.

4. The system of claim 1, further comprising a camera actuator configured to move the camera relative to the third mirror and the fourth mirror.

5. The system of claim 1, wherein the first mirror and the second mirror are disposed on opposite sides of the outer surface of the workpiece.

6. The system of claim 1, further comprising a second of the inspection module, wherein the first mirror and the second mirror of the second of the inspection module are disposed at a 90° angle relative to the first mirror and the second mirror of the inspection module, respectively.

7. The system of claim 6, wherein the nozzle actuator is configured to move the workpiece between the inspection module and the second of the inspection module.

8. A method comprising:
directing light from a first light source at an outer surface of a workpiece in a first inspection module;
receiving the light from the first light source reflected from the outer surface of the workpiece at a camera, wherein the light from the first light source that is reflected from the outer surface of the workpiece is directed to the camera via a first mirror and a first semi-mirror; and
receiving the light from the first light source transmitted through the workpiece at the camera, wherein the light from the first light source that is transmitted through the workpiece is directed to the camera via a second mirror and a second semi-mirror.

9. The method of claim 8, further comprising, using the camera, taking an image of the light from the first light source that is reflected from the outer surface of the workpiece and an image of the light from the first light source transmitted through the workpiece in a single exposure of a sensor in the camera.

10. The method of claim 8, further comprising directing light in the first inspection module from a second light source at a point on the outer surface of a workpiece 180° from that of the first light source, wherein the directing light from the second light source is simultaneous with the directing light from the first light source, and wherein the light from the second light source is at a lower intensity than that of the first light source.

11. The method of claim 8, further comprising:
directing light from a second light source at a point on the outer surface of a workpiece 180° from that of the first light source in the first inspection module;
receiving the light from the second light source reflected from the outer surface of the workpiece at the camera, wherein the light from the second light source that is reflected from the outer surface of the workpiece is directed to the camera via the second mirror and the second semi-mirror; and
receiving the light from the second light source transmitted through the workpiece at the camera, wherein the light from the second light source that is transmitted through the workpiece is directed to the camera via the first mirror and the first semi-mirror.

12. The method of claim 11, further comprising, using the camera, taking an image of the light from the second light source that is reflected from the outer surface of the workpiece and an image of the light from the second light source transmitted through the workpiece in a single exposure of a sensor in the camera.

13. The method of claim 11, directing light from the first light source at a point on the outer surface of a workpiece 180° from that of the second light source in the first inspection module, wherein the directing light from the first light source is simultaneous with the directing light from the second light source, and wherein the light from the first light source is at a lower intensity than that of the second light source.

14. The method of claim 8, further comprising positioning a focal plane inside the workpiece by adjusting a position of the camera and/or the first mirror, the first semi-mirror, and the first light source.

15. The method of claim 8, further comprising tuning a wavelength of the light from the first light source thereby adjusting a penetration depth of the light from the first light source in the workpiece.

16. The method of claim 8, further comprising:
positioning the workpiece on a nozzle in fluid communication with a vacuum pump; and
moving the workpiece on the nozzle relative to the first mirror using a nozzle actuator.

17. The method of claim 16, further comprising moving the workpiece from the first inspection module to a second inspection module.

18. The method of claim 17, further comprising:
directing light from a first light source at the outer surface of the workpiece in a second inspection module;
receiving the light from the first light source reflected from the outer surface of the workpiece at a camera in the second inspection module, wherein the light from the first light source that is reflected from the outer surface of the workpiece is directed to the camera in the second inspection module via a first mirror and a first semi-mirror in the second inspection module; and
receiving the light from the first light source transmitted through the workpiece at the camera in the second inspection module, wherein the light from the first light source that is transmitted through the workpiece is directed to the camera in the second inspection module via a second mirror and a second semi-mirror in the second inspection module;

wherein the first mirror and the second mirror of the second inspection module are disposed at a 90° angle relative to the first mirror and the second mirror of the first inspection module.

19. The method of claim 18, further comprising:

directing light from a second light source at a point on the outer surface of a workpiece 180° from that of the first light source in the second inspection module;

receiving the light from the second light source reflected from the outer surface of the workpiece at the camera in the second inspection module, wherein the light from the second light source that is reflected from the outer surface of the workpiece is directed to the camera in the second inspection module via the second mirror and the second semi-mirror in the second inspection module; and receiving the light from the second light source transmitted through the workpiece at the camera in the second inspection module, wherein the light from the second light source that is transmitted through the workpiece is directed to the camera in the second inspection module via the first mirror and the first semi-mirror in the second inspection module.

20. The method of claim 8, wherein the workpiece is fabricated of one of silicon, gallium nitride, or gallium arsenide.

* * * * *